US009355814B2

(12) United States Patent
Nomaguchi et al.

(10) Patent No.: US 9,355,814 B2
(45) Date of Patent: May 31, 2016

(54) CHARGED PARTICLE BEAM APPARATUS

(71) Applicant: Hitachi High-Technologies Corporation, Minato-ku, Tokyo (JP)

(72) Inventors: Tsunenori Nomaguchi, Tokyo (JP); Toshihide Agemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 18 days.

(21) Appl. No.: 14/390,583

(22) PCT Filed: Mar. 4, 2013

(86) PCT No.: PCT/JP2013/055772
§ 371 (c)(1),
(2) Date: Oct. 3, 2014

(87) PCT Pub. No.: WO2013/150847
PCT Pub. Date: Oct. 10, 2013

(65) Prior Publication Data
US 2015/0083910 A1    Mar. 26, 2015

(30) Foreign Application Priority Data

Apr. 3, 2012   (JP) ................................. 2012-084426

(51) Int. Cl.
*H01J 37/244*   (2006.01)
*H01J 37/10*    (2006.01)
*H01J 37/26*    (2006.01)

(52) U.S. Cl.
CPC .............. *H01J 37/244* (2013.01); *H01J 37/10* (2013.01); *H01J 37/26* (2013.01); *H01J 2237/05* (2013.01); *H01J 2237/2446* (2013.01); *H01J 2237/24495* (2013.01)

(58) Field of Classification Search
None
See application file for complete search history.

(56) References Cited

U.S. PATENT DOCUMENTS 5,644,132 A * 7/1997 Litman ................. H01J 37/244
                                             250/310
6,043,491 A * 3/2000 Ose ....................... H01J 37/244
                                             250/310

(Continued)

FOREIGN PATENT DOCUMENTS

JP    2001-84946 A    3/2001
JP    2003-157791 A   5/2003

(Continued)

OTHER PUBLICATIONS

International Search Report dated Jun. 25, 2013 with English translation (five (5) pages).

*Primary Examiner* — Nicole Ippolito
*Assistant Examiner* — Sean Luck
(74) *Attorney, Agent, or Firm* — Crowell & Moring LLP

(57) ABSTRACT

Aiming for easily carrying out an energy discrimination or an angle discrimination of a secondary particle emitted from a sample or easily setting an optimal observation condition, a charged particle beam apparatus is provided with a charged particle source for emitting a charged particle beam, a lens for focusing the charged particle beam to a sample, a detector for detecting a secondary particle emitted from the sample, and an orbit simulator for calculating a position at which the secondary particle emitted from the sample arrives; and in this structure, the orbit simulator calculates an orbit of a secondary particle that satisfies a predetermined condition, and a sample image is formed by using a signal detected at a position where the secondary particle satisfying the predetermined condition arrives at the detector.

18 Claims, 7 Drawing Sheets

(56) References Cited

U.S. PATENT DOCUMENTS

Figure 1:
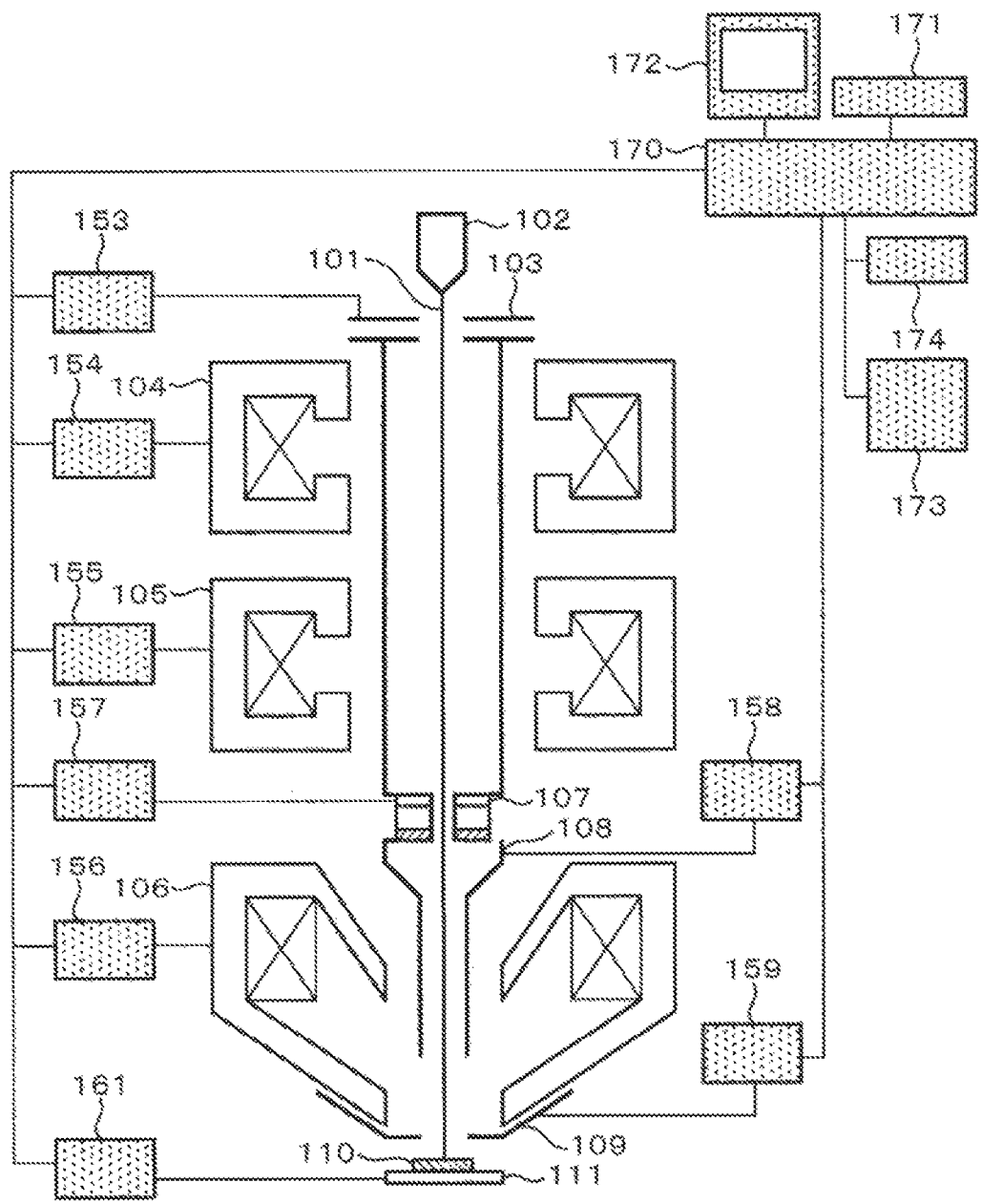

| | | | |
|---|---|---|---|
| 6,531,697 B1 * | 3/2003 | Nakamura | H01J 37/1471 250/302 |
| 2005/0035291 A1 * | 2/2005 | Hill | H01J 37/026 250/309 |
| 2005/0230636 A1 * | 10/2005 | Tanaka | H01J 37/20 250/440.11 |
| 2005/0285037 A1 * | 12/2005 | Nakamura | H01J 37/04 250/311 |
| 2006/0016990 A1 * | 1/2006 | Suzuki | H01J 37/21 250/310 |
| 2007/0187595 A1 * | 8/2007 | Tanaka | G01N 23/2251 250/307 |
| 2007/0272857 A1 * | 11/2007 | Hasegawa | H01J 37/29 250/307 |
| 2008/0116375 A1 * | 5/2008 | Ikegami | G01N 23/225 250/307 |
| 2009/0224151 A1 | 9/2009 | Hatakeyama et al. | |
| 2011/0233399 A1 | 9/2011 | Ichimura et al. | |
| 2012/0298864 A1 | 11/2012 | Morishita et al. | |

FOREIGN PATENT DOCUMENTS

| | | |
|---|---|---|
| JP | 2007-48686 A | 2/2007 |
| JP | 2010-135072 A | 6/2010 |
| WO | WO 2011/089955 A1 | 7/2011 |

* cited by examiner

CHARGED PARTICLE BEAM APPARATUS

TECHNICAL FIELD

The present invention relates to a charged particle beam apparatus for carrying out an observation on a sample by using charged particle beams.

BACKGROUND ART

In recent years, scanning charged particle beam apparatuses have been widely used in various industrial fields, such as semiconductor field, materials field, medical field and so forth, because of its high spatial resolution. In the observation using the scanning charged particle beam apparatuses, in general, a charged particle beam is irradiated to a sample, and secondary electrons, reflected electrons, etc. emitted from the irradiation position are detected.

As disclosed in Patent Document 1, a secondary electron image indicates contrast mainly reflecting a surface shape of a sample. Moreover, in addition to the surface shape of a sample, a reflected electron image also indicates contrast reflecting its composition. Therefore, by detecting the secondary electrons and reflected electrons in a discriminating manner, various pieces of information of the sample can be obtained. So far, as a method for discriminating the secondary electrons and the reflected electrons, methods have been developed in which a plurality of detectors disposed on the inside and outside of a charged particle beam column are used and in which an energy filtering is carried out by using a multi-pore electrode (Patent Document 2). Moreover, in Patent Document 1, a discriminating method for secondary electrons and reflected electrons by the use of a position sensitive detector is described. Advantages of this method include that an energy filtering can be carried out by using only the single detector.

CITATION LIST

Patent Documents

Patent Document 1: Japanese Patent Application Laid-Open Publication No. 2010-135072
Patent Document 2: Patent Publication No 4069624

SUMMARY

Problems to be Solved by the Invention

The inventors of the present invention have extensively examined the discriminating method for secondary electrons and reflected electrons, and have come to obtain the following findings.

Patent Document 1 has proposed the method in which the position sensitive detector (for example, CCD detector) is used. However, the arrival position of electrons emitted differ depending not only on the energy of electrons, but also on conditions of a focusing lens, as well as on an angle at which the electron is emitted from a sample. For this reason, in order to accurately discriminate electrons having a desired energy or electrons emitted at a desired angle, the detection conditions of the position sensitive detector have to be set precisely for each of the cases. Therefore, setting the position sensitive detector to conditions suitable for an observation requires very complicated jobs.

Moreover, Patent Document 2 has proposed a method for carrying out an energy filtering by the use of an electrode. However, the energy region or angle region suitable for an observation is greatly dependent on samples. For this reason, in becomes very difficult for an operator unfamiliar with observation to accurately set observation conditions. Furthermore, the observation results vary greatly also depending on the energy of an irradiation electron beam. Therefore, setting the energy of the irradiation electron beam also causes one of time-consuming difficult jobs for the operator unfamiliar with observation.

The present invention provides an apparatus capable of solving these problems.

Means for Solving the Problems

A first charged particle beam apparatus according to the present invention is provided with an orbital calculation simulator for calculating a position at which a secondary particle emitted from a sample arrives, or a data base in which a position at which a secondary particle emitted from a sample arrives is recorded, or a data base in which conditions of a secondary particle to be detected by the detector are recorded.

A second charged particle beam apparatus according to the present invention is provided with two or more lenses for use in focusing a charged particle beam onto a sample, a controller for controlling the lenses independently, a detector for detecting a secondary particle emitted from the sample, and an operation unit for comparing signals obtained by the detector with each other for each of the lens conditions.

Effects of the Invention

By using the present invention, it becomes possible to easily carry out an energy discrimination or an angle discrimination on secondary particles emitted from a sample. Moreover, it becomes possible to easily set optimal observation conditions.

BRIEF DESCRIPTIONS OF THE DRAWINGS

Figure 2:
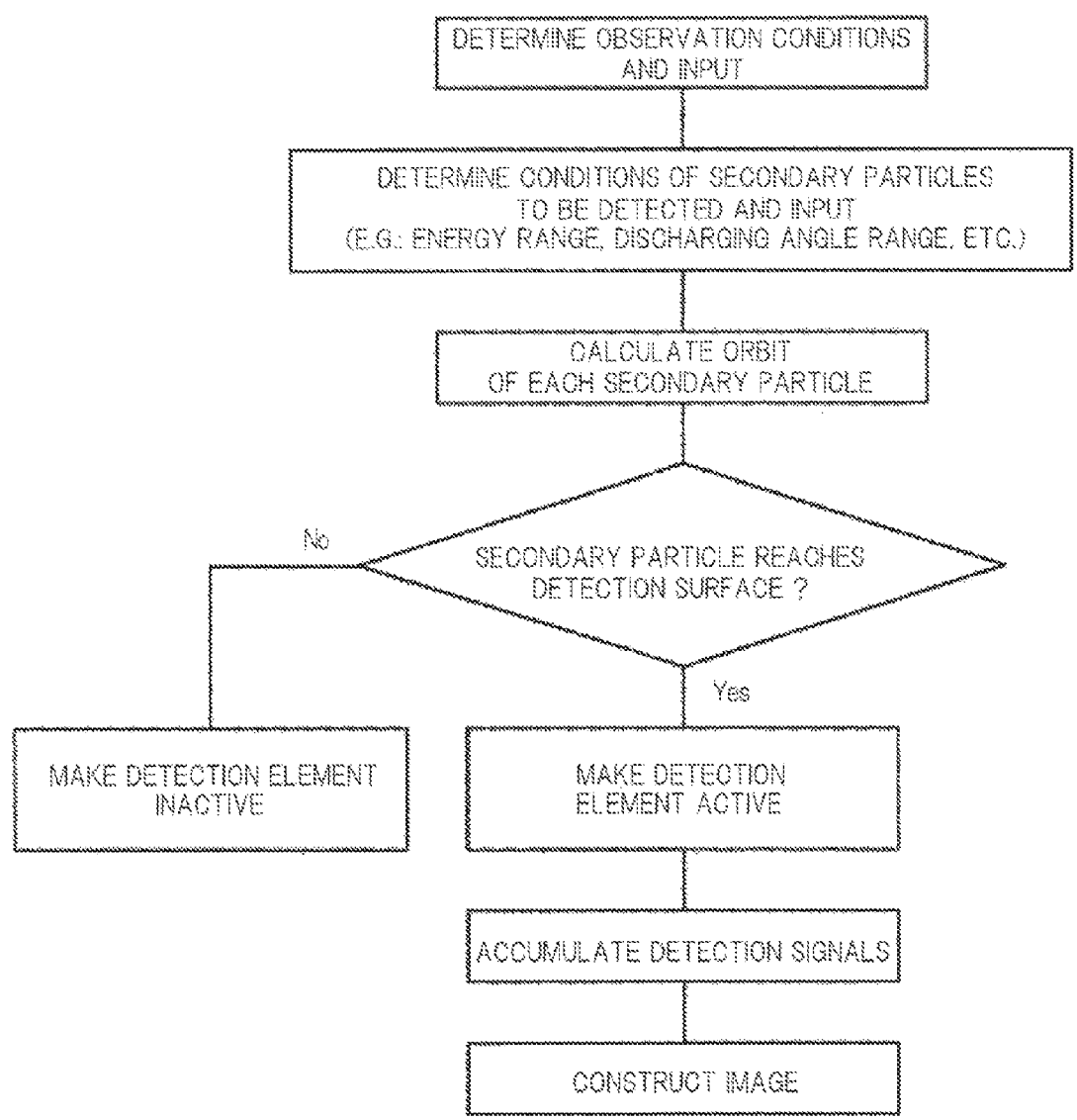
Figure 3:
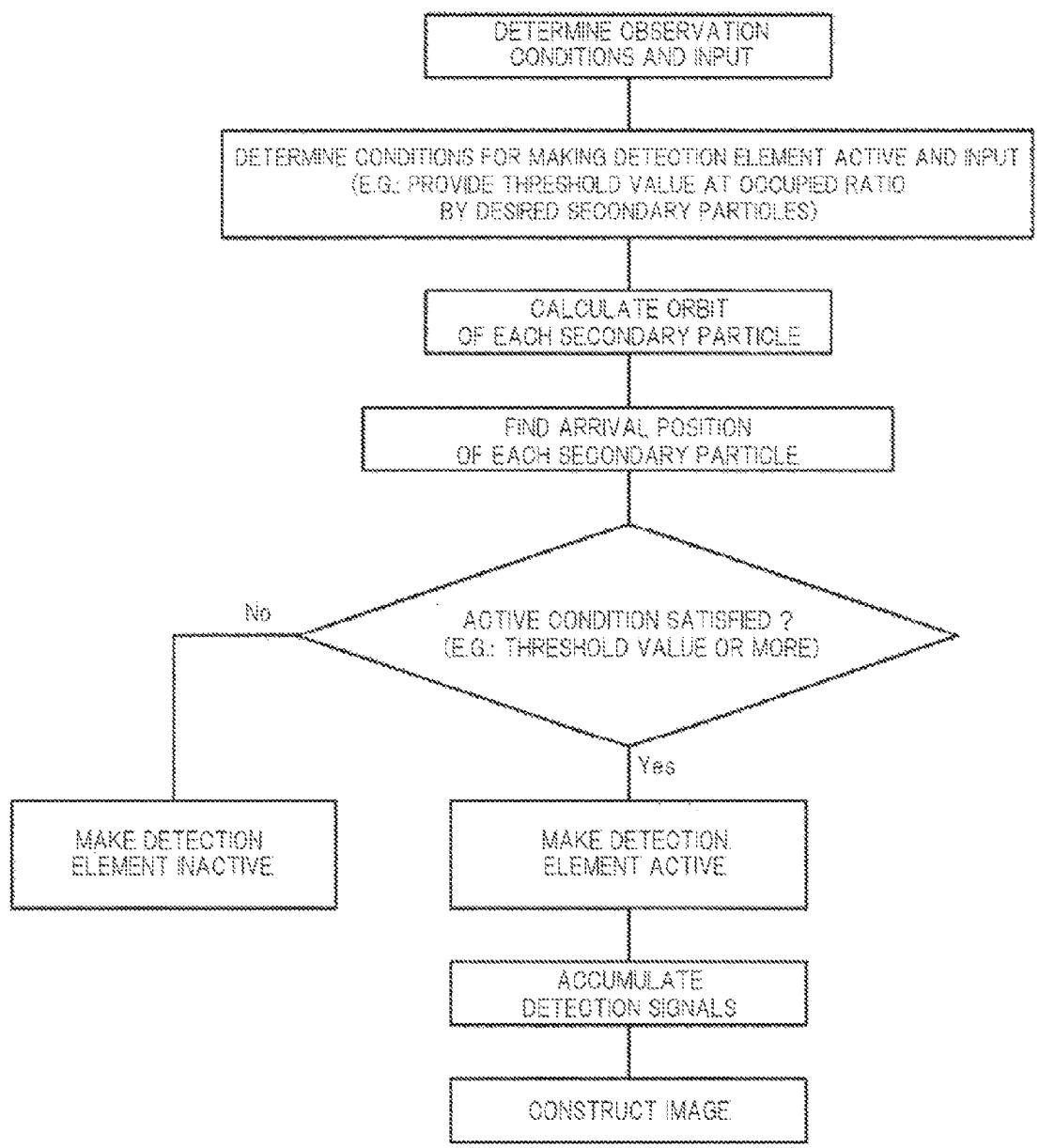
Figure 4:
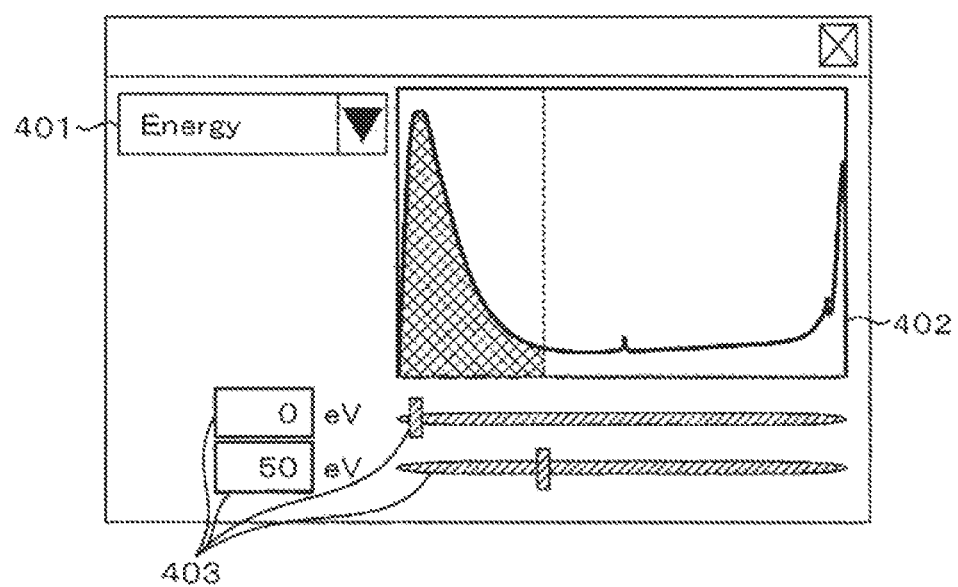
Figure 5:
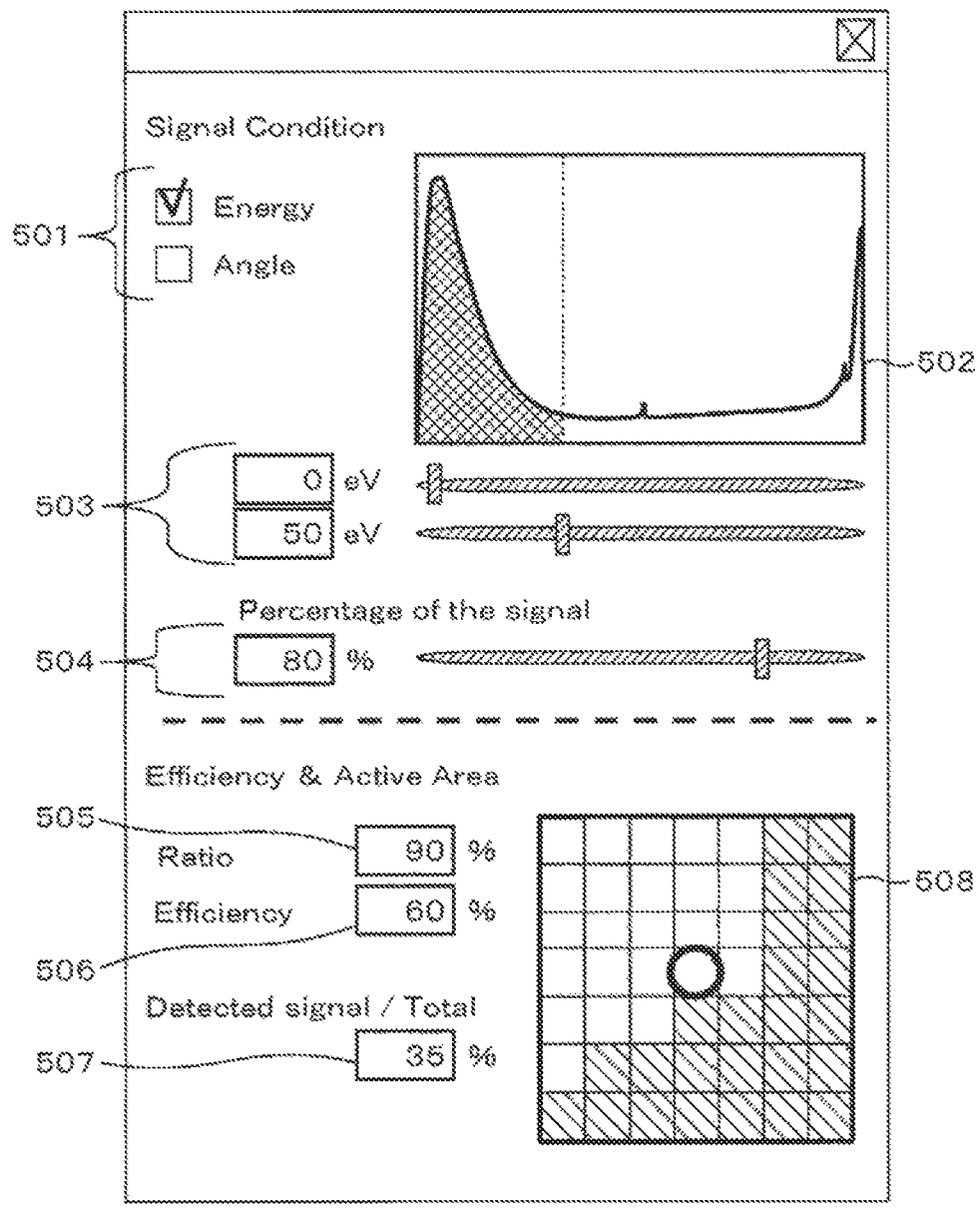
Figure 6:
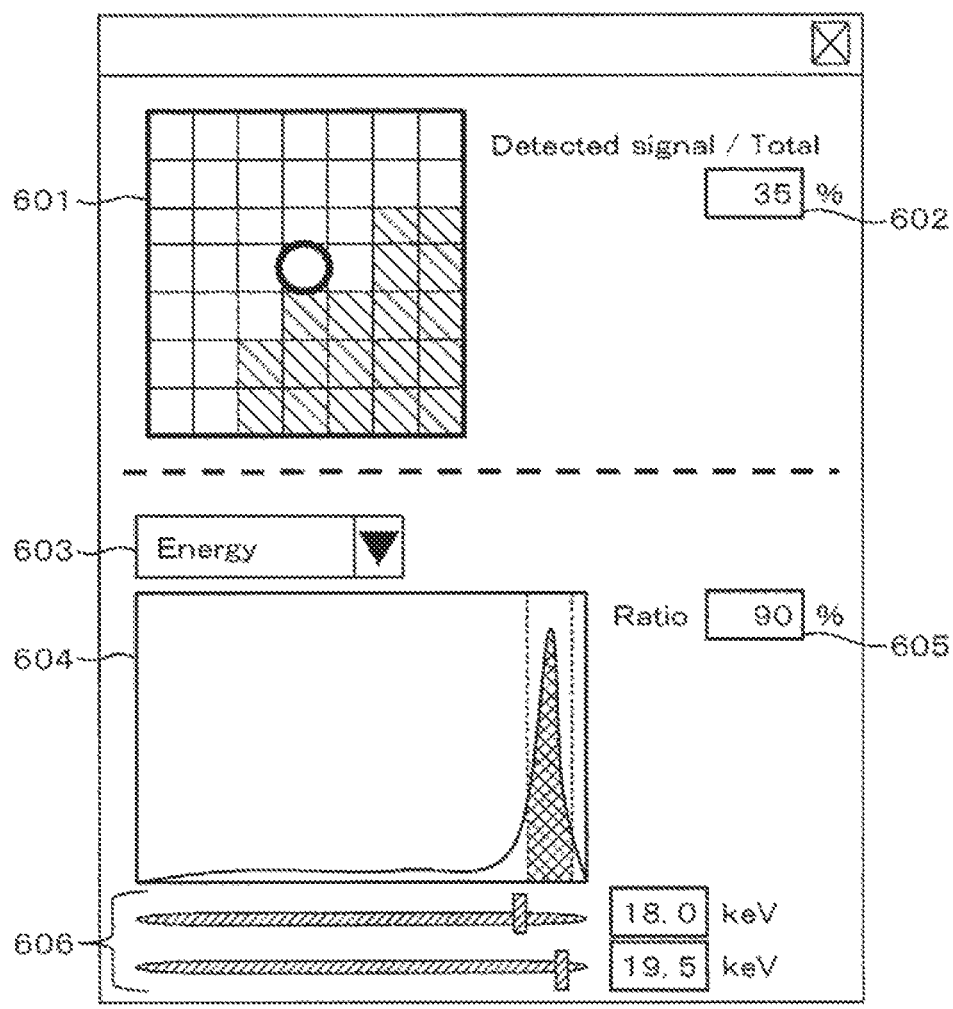
Figure 7:
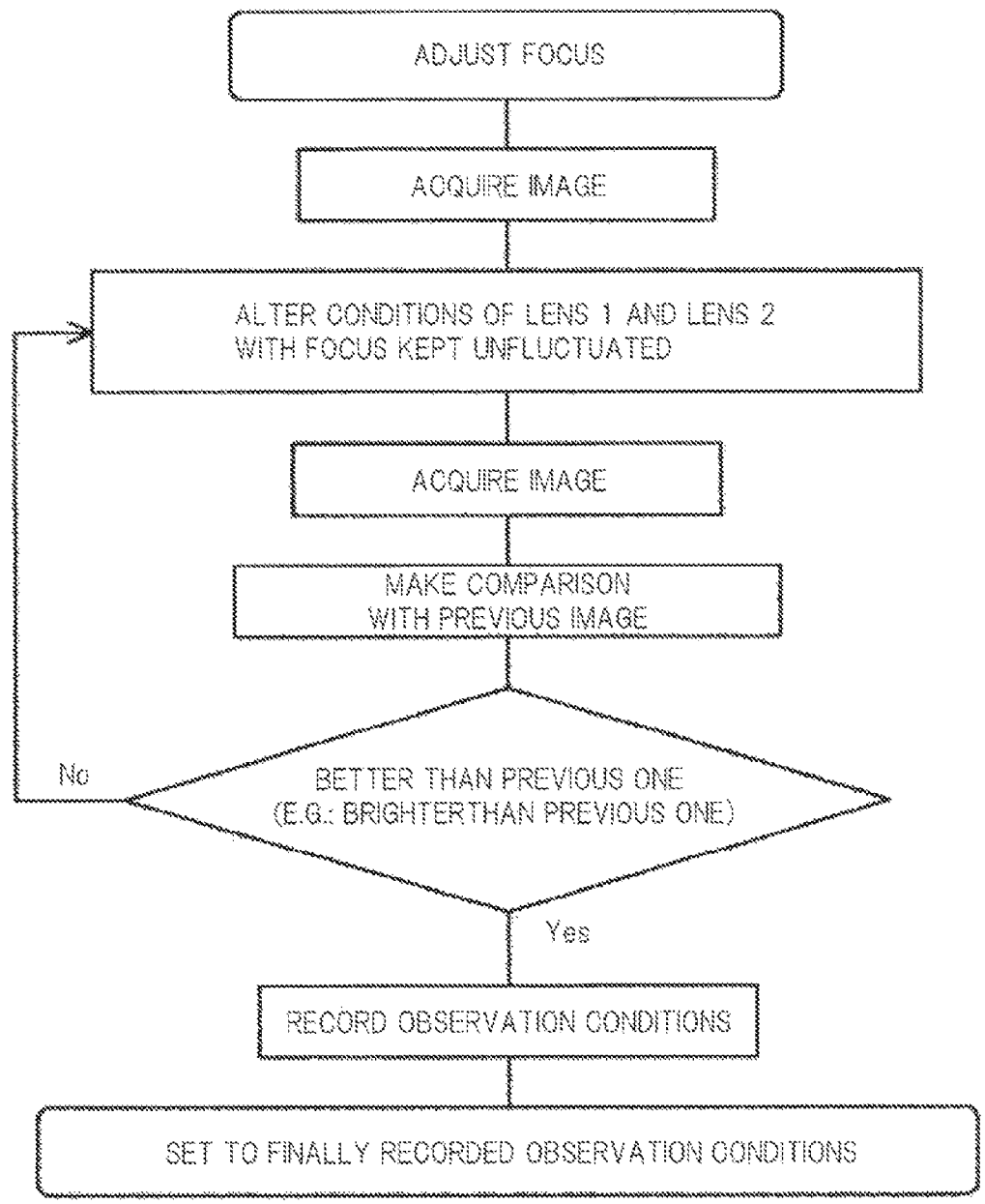

FIG. 1 is a schematic diagram showing a charged particle beam according to an embodiment of the present invention;
FIG. 2 is a flow chart 1 showing an example of a controlling flow of a detector;
FIG. 3 is a flow chart 2 showing an example of a controlling flow of the detector;
FIG. 4 is a diagram showing one example of a GUI screen for use in setting an energy range or an angle range of a secondary electron to be detected;
FIG. 5 is a diagram showing one example of a GUI screen for use in setting a threshold value for detection efficiency;
FIG. 6 is a diagram showing one example of a GUI screen that informs active detection elements and conditions of secondary particles to be detected; and
FIG. 7 is a flow chart showing one example of a controlling flow of a focusing lens.

DETAILED DESCRIPTION

With reference to the drawings, the following descriptions will explain the present invention.

Embodiment 1

(Apparatus Configuration of Charged Particle Beam Apparatus)

FIG. 1 is a schematic diagram showing a charged particle beam apparatus according to one embodiment of the present invention.

In FIG. 1, a charged particle beam apparatus is provided with a charged particle source 102 for generating a charged particle beam 101, and the charged particle beam 101 emitted from the charged particle beam source 102 is accelerated by an acceleration electrode 103. An acceleration voltage for use in accelerating the charged particle beam 101 is controlled by an acceleration electrode controller 153 for controlling the acceleration electrode 103.

The charged particle beam 101 is deflected by a first condenser lens 104 and a second condenser lens 105 so that the transmission amount of the charged particle beam 101 passing through a diaphragm, not shown, is adjusted, and the amount of the charged particle beam 101 to be irradiated to a sample 110 is controlled. The first condenser lens 104 and the second condenser lens 105 are respectively controlled by a first condenser lens controller 154 and a second condenser lens controller 155.

The charged particle beam 101 is irradiated with its focus being adjusted on the surface of a sample 110 by an objective lens 106, and secondary particles (secondary electrons, reflected electrons and the like) emitted from the irradiation position of the charged particle beam 101 on the sample 110 are detected by a position sensitive detector 107. The objective lens 106 is controlled by an objective lens controller 156 and the position sensitive detector 107 has a configuration in which an element such as a CCD element or the like is disposed on each of positions so that detection of secondary particles is carried out for each of the positions. Moreover, the element at each of the positions can be made active/inactive. In this case, the active element refers to such an element as to make a signal acquired by the element active. Therefore, not only a system for carrying out ON/OFF of the elements, but also a system for determining active/inactive of a signal by a post process can be included. The position sensitive detector 107 is controlled by a detector controller 157.

A first electrode 108 which makes the charged particle beam 101 to pass through the objective lens 106 with high energy may be installed, and in this case, the first electrode is controlled by a first electrode controller 158. Moreover, a second electrode 109 disposed in the vicinity of an outlet of the objective lens may be installed, and in this case, the second electrode 109 is controlled by a second electrode controller 159.

The sample 110 is disposed on a sample stage 111, and the sample stage 111 is controlled in its height, inclination and the like by a stage controller 161.

An integrated computer 170 controls operations of the entire apparatus, such as the respective controllers and the like, and carries out a configuration of a charged particle beam image. By using a controller 171 (key board, mouse or the like), the operator can input various instructions and the like, such as irradiation conditions of the charged particle beam 101, conditions of a voltage and an electric current to be applied to the respective electrodes and the like, and stage positional conditions, etc., into the integrated computer 170. The secondary particle image and the control screen thus acquired are displayed on a display 172.

In the present invention, an orbit simulator 173 for calculating the orbit (trajectory) of a secondary particle emitted from the sample and an operation unit 174 for analyzing the results of the orbit simulator are installed. Additionally, the functions of the orbit simulator 173 and the operation unit 174 may be compatibly carried out by the integrated computer 170.

Although not shown in the drawings, the charged particle beam apparatus is provided with all the configurations required for the charged particle beam apparatus, such as a deflection system or the like, for use in scanning and shifting the charged particle beam 101. Moreover, the respective controllers and the operation unit are mutually communicatable, and controlled by the integrated computer 170.

(Concerning Orbit Simulator)

The following description will explain she orbit simulator in detail. The orbit simulator reproduces a generation process of reflected electrons and secondary electrons generated by the charged particles made incident on the sample by using random numbers, and by repeatedly carrying out calculations, calculates the emitting angle, energy or the like of the reflected electrodes and secondary electrons. A Monte Carlo simulation or the like is used as the calculations. In order to carry out the simulation, the shape and composition of the sample 110, incident conditions of the charged particle beam 101, that is, dispositions of the respective electrodes, detectors, or the like, and control conditions of the respective controllers, are inputted.

(Control Method of Detector Using Orbit Simulator)

With reference to FIG. 2, the following description will explain a control method of a detector using an orbit simulator.

(Step 1) Energy of the charged particle beam 101 to be irradiated to a sample and lens conditions of the objective lens 106 are determined, and these are inputted to the orbit simulator 173. For example, an acceleration voltage, an excitation current of the objective lens and the like are inputted thereto.

(Step 2) Conditions of secondary particles to be desirably detected are determined and inputted to the orbit simulator 173. For example, the energy range and angle range of secondary particles to be detected are determined. At this time, it is convenient to use a GUI screen (FIG. 4) having item 401 (for example, energy range and angle range of secondary particles, and kinds of secondary particles, such as secondary ions, secondary electrons and the like) for use in determining kinds of signal discriminations, spectrum 402 indicating the distribution of each signal, and item 403 for use in selecting the range of secondary particles to be detected. In this manner, in the case when item 403 for use in selecting the range of secondary particles to be detected is prepared, since only the energy range desired by the operator can be detected, it is possible to detect secondary particles more precisely.

(Step 3) The orbit of the desired secondary particle that satisfies the desired observation conditions set in step 2 is calculated by the orbit simulator 173.

(Step 4) The arrival point of the secondary particle in the position sensitive detector 107 is found.

(Step 5) The element of the position sensitive detector at which the desired secondary particle arrives is made active.

(Step 6) The signal of the active element is accumulated.

(Step 7) Based upon the accumulated signal, an image is constructed.

By using the above-described flow of processes, the operator selectively detects desired secondary particles, and a secondary particle image can be formed by using the resulting secondary particles; therefore, it becomes possible to analyze the sample more precisely.

Embodiment 2

The element to be made active may be set based upon a ratio at which the desired secondary particles arrive. With reference to FIG. 3, the explanation will be given. The control method has the following steps.

(Step 1) Desired observation conditions, such as energy of the charged particle beam to be irradiated to a sample and lens conditions of the objective lens are determined, and these are inputted to the orbit simulator 173. For example, an acceleration voltage, an excitation current of the objective lens and the like are inputted thereto.

(Step 2) Conditions of secondary particles to be desirably detected are determined and inputted to the orbit simulator 173. For example, the energy range and angle range of secondary particles to be detected are determined.

(Step 3) The orbit of the desired secondary particle that satisfies the desired observation conditions set in step 2 is calculated by the orbit simulator 173.

(Step 4) The arrival point of the secondary particle in the position sensitive detector 107 is found.

(Step 5) In the elements of respective positions of the position sensitive detector, a ratio at which the desired secondary particle arrives (a ratio of the amount of the desired secondary particle with respect to the amount of a whole of the secondary signals made incident on the respective elements) is calculated.

(Step 6) The threshold value of the ratio of the elements to be made active is determined. At this time, as shown in FIG. 5, it is convenient to use a GUI screen having item 501 for use in determining kinds of signal discriminations, spectrum 502 indicating the distribution of each signal, item 503 for use in selecting the range of secondary particles to be detected and item 504 for use in determining the condition (threshold value) in which the detection elements are made active because the secondary particles to be obtained can be easily set. Moreover, it becomes further convenient when a display unit 505 for indicating the ratio of the desired signal at each of the positions, a display unit 506 for indicating the detection efficiency of the desired signal, a display unit 507 for indicating the detection efficiency with respect to the entire signal and a display unit 508 for informing the active elements are installed, because a guidance for determining the threshold value is given.

(Step 7) The signal of the active element is accumulated.

(Step 8) Based upon the accumulated signal, an image is constructed.

In the present embodiments, two flows of processes have been exemplified; however, the control flow is not particularly limited in a method for controlling the detector (or an operation unit for constructing an image) based upon the results obtained by the orbit simulator. Moreover, in place of the orbit simulator, by using a data base in which positions at which secondary particles arrive are recorded or a data base in which conditions of secondary particles to be detected are recorded, the detector may be controlled.

Embodiment 3

The CCD detector has been exemplified as the position sensitive detector 107; however, in addition to this, a method for directly detecting electrons by using semiconductor detectors planarly arranged or a method in which light emission by a scintillator is detected by an optical camera or a photomultiplier tube through a lens or an optical fiber may be proposed. Moreover, although the position sensitive detector has been used, detectors divided into a concentric circle manner, detectors divided into a radial manner, detectors divided into a concentric circle manner as well as into a radial manner, or detectors arranged into an annular manner may also be adopted. The important thing is to be capable of making the detectors active/inactive for each of the positions of the detection surface of the detector.

Furthermore, in FIG. 1, the detector is disposed on an optical axis of the charged particle beam 101; however, the signal may be detected at a position spaced apart from the optical axis by using an orthogonal electromagnetic field (EXB) or the like, or a detection system provided with energy-filtering electrodes may be used. In this case, however, it is necessary to carry out a simulation process in which a system that gives effects to the orbit of secondary particles, such as EXB or energy filtering electrodes, is taken into account. Moreover, in the case of a detection system using a conversion plate (detection system in which secondary particles are further made to collide with a conversion plate so that tertiary particles emitted from the conversion plate are detected) as well, by calculating the orbit of the secondary particle that collides with the conversion plate, the same effects can be obtained.

Moreover, the secondary particles that are emitted from a sample have been exemplified; however, the present apparatus may be effectively used as a device in which a transmitted charged particle is used as a signal, such as a transmission-type electron microscope, a scanning transmission electron microscope (STEM), and the like. For example, in becomes possible to easily carry out settings of the detector at the time of extracting a specific spot in a diffraction pattern or at the time when an annular dark-field (ADF) image is obtained.

Moreover, although the description will branch off from the control of the detector, the present apparatus is effectively used when there is an indication for informing an energy distribution or an angle distribution of secondary particles when those particles are detected when each of the detection elements or the range thereof is selected, upon analyzing the resulting image or examining the observation conditions thereof. For example, as shown in FIG. 6, it is convenient to provide a GUI screen having a display unit 601 for use in setting each of the elements or the range of the detector, a detection efficiency display unit 602, a spectrum display unit 604 for indicating the energy distribution and angle distribution of secondary particles to be detected, a display unit 605 for indicating the ratio of a desired signal to be detected, and item 606 for use in setting the desired signal.

Embodiment 4

(Control Method of Two or More Focusing Lenses Independently Controllable)

In the present embodiment, an electrostatic lens is formed between a first electrode 108 and a second electrode 109. That is, in the present embodiment, a magnetic field lens formed by the electrostatic lens and the objective lens 106 is prepared as a lens for focusing a beam on a sample. In this case, a control method for a focusing lens in the present invention will be explained by using this focusing lens system.

When the intensities of the magnetic field lens and the electrostatic lens change, the orbits of secondary particles to be emitted from the sample also change. Therefore, the detected secondary particles also change. In other words, the resulting contrast is also changed. Consequently, it is desirable to set optimal conditions of the objective lens and the electrostatic lens depending on an object to be observed. Therefore, with reference to FIG. 7, the following description will explain one example of a control flow of processes for use in retrieving lens conditions optimal to the observation.

(Step 1) Focus a beam onto a sample.

(Step 2) The objective lens and the electrostatic lens are altered in cooperation with each other, in a manner so as not to change the focal point. In this case, since, although the focal point is not changed, the intensities of the objective lens 106 and the electrostatic lens are changed, the orbit of a secondary particle to be emitted from the sample is changed. That is, the obtained image is changed.

(Step 3) An image is obtained under each of the conditions.

(Step 4) Acquired images are compared with each other. For example, an acquiring condition for obtaining the brightest image is retrieved.

(Step 5) The retrieved condition is set as the observation condition.

In the present embodiment, the brightest image is used as a determination criterion; however, an image having the highest change in contrast may be used as the criterion, or only the gradation in a specific region may be taken into consideration. In an attempt to determine the acquiring condition of an image, the comparison criterion is not particularly limited. Moreover, the present control flow can be executed regardless of the kinds of detectors. That is, it can be executed by using any one of systems including a system provided with one element, a system composed of a plurality of detectors and a system composed of element-split detectors.

Moreover, in the present embodiment, the electrostatic lens formed by the first electrode 108 and the second electrode 109 is used so as to enable transmission through the objective lens 106 with high energy; however, an electrostatic lens specially prepared for the present object may be used. Furthermore, the same control flow can be executed even in the combination of the objective lens 106 and the second condenser lens 105. In this case, with respect to the combination of lenses, both of the lenses may be prepared as magnetic field, lenses or both of the lenses may be prepared as electrostatic lenses, or a mixed combination of a magnetic field lens and an electrostatic lens may be used. With respect to the number of focusing lenses, two of them may be used in the same manner as in the present embodiment, or three or more of them may be used.

Moreover, in the present embodiment, the observation condition is determined by comparing the actually acquired images; however, by calculating detection efficiencies in the respective observation conditions by using an orbit simulator, and the observation conditions may be determined based upon the results. In this case, the detection efficiencies may be calculated, with the energy and emitting angle of the secondary particles being limited.

Furthermore, based upon the combination of the objective lens condition and acceleration voltage condition, the orbit of the secondary particles can also be altered without altering the focal point. Therefore, by executing the same flow as the above-mentioned flow, the objective lens condition and acceleration voltage condition suitable for the observation can be retrieved.

Moreover, by moving the sample position to the focal point of the objective lens as well, the distribution of secondary particles to be detected can be altered. However, in the case of installing two charged particle beam columns, such as in the case of an FIB-SEM device or the like, the sample is desirably disposed at a position where the optical axes of the two charged particle beam columns cross each other. Therefore, the focal point is desirably set to a constant point.

By the present inventions described in the above-mentioned respective embodiments, it is possible to provide a charged particle beam apparatus that can easily carry out an energy discriminating process or an angle discriminating process of secondary particles emitted from a sample. Moreover, it is also possible to provide a charged particle beam apparatus capable of easily setting optical observation conditions. Thus, it becomes possible to improve the efficiency of processing and observing operations by the use of a charged particle beam, and also to improve the operability thereof.

EXPLANATION OF REFERENCE NUMERALS

101 Charged particle beam
102 Charged particle beam source
103 Acceleration electrode
104 First condenser lens
105 Second condenser lens
106 Objective lens
107 Position sensitive detector
108 First electrode
109 Second electrode
110 Sample
111 Sample stage
153 Acceleration electrode controller
154 First condenser lens controller
155 Second condenser lens controller
156 Objective lens controller
157 Detector controller
158 First electrode controller
159 Second electrode controller
161 Stage controller
170 Integrated computer
171 Controller
172 Display
173 Orbit simulator
174 Operation unit
401, 501 Item for use in determining kinds of signal discrimination
402, 502 Spectrum indicating distribution of each signal
403, 503 Item for use in selecting a range of secondary particles to be detected
504 Item for use in determining a condition (threshold value) in which detection elements are made active
505 Display unit for indicating a ratio of a desired signal
506 Display unit for indicating a detection efficiency of a desired signal
507 Display unit for indicating a detection efficiency with respect to the entire signals
508 Display unit for informing active elements
601 Display unit for use in setting each element or range of a detector
602 Detection efficiency display unit
603 Item for use in setting axis of abscissas at the time of displaying spectrum
604 Spectrum display unit for indicating an energy distribution and an angle distribution of secondary particles to be detected
605 Display unit for indicating a ratio of a desired signal to be detected
606 Item for use in setting a desired signal

The invention claimed is:

1. A charged particle beam apparatus comprising: a charged particle source for emitting a charged particle beam; a lens for focusing the charged particle beam onto a sample; a detector for detecting a secondary particle emitted from the sample;
an orbit simulator for calculating a position at which the secondary particle emitted from the sample arrives at the detector;
a setting screen for setting desired condition of the secondary particle; and a display for displaying the setting screen, wherein the orbit simulator calculates an orbit of a secondary particle that satisfies a predetermined condition of an orbit trajectory, and a sample image is formed by using a signal detected at the position where the secondary particle satisfying the predetermined condition arrives at the detector.

2. A charged particle beam apparatus comprising: a charged particle source for emitting a charged particle beam; a lens for focusing the charged particle beam onto a sample; a detector for detecting a secondary particle emitted from the sample; a setting screen for setting a valid detection surface of the detector; a display for displaying the setting screen; and an orbit simulator for calculating a position at which the secondary particle emitted from the sample arrives at the detector, wherein a distribution of secondary particles arriving at the valid detection surface after being emitted from the sample is displayed based on a calculation result of the orbit simulator, the calculation result satisfying a predetermined condition of an orbit trajectory, and a sample image is formed by using a signal detected at the position where the secondary particle satisfying the predetermined condition arrives at the detector.

3. The charged particle beam apparatus according to claim 1, wherein the detector is a position sensitive detector in which elements are arranged for the respective positions of a detection surface.

4. The charged particle beam apparatus according to claim 1, wherein the detector is a split-type detector in which a detection surface is divided.

5. The charged particle beam apparatus according to claim 1, wherein the setting screen is provided with a setting screen for use in setting energy of the secondary particle.

6. The charged particle beam apparatus according to claim 1, wherein the setting screen is provided with a setting screen for use in setting an angle range of an emitting angle of the secondary particle.

7. The charged particle beam apparatus according to claim 1, wherein the setting screen is provided with a setting screen for use in setting a ratio of the secondary particle that satisfies a predetermined condition with respect to the whole of the detection amount of the secondary particles at a predetermined position of the detector.

8. A charged particle beam apparatus comprising:
a charged particle source for emitting a charged particle beam;
a lens for focusing the charged particle beam to a sample;
a detector for detecting a secondary particle emitted from the sample;
a data base that records a condition of the secondary particle to be detected by the detector, including a position at which the secondary particle emitted from the sample arrives at the detector;
a setting screen for setting a condition of a desired secondary particle; and
a display for displaying the setting screen;
wherein the data base records a calculated orbit of a secondary particle that satisfies a predetermined condition of an orbit trajectory, and the data base records a position at which the secondary particle satisfying the predetermined condition arrives at the detector, and by using a signal detected at the position of the arrival, a sample image is formed.

9. The charged particle beam apparatus according to claim 8, wherein the data base further records the condition of a secondary particle detected at each of the positions of the detector, and a sample image is formed by using a signal detected at a position in which the condition of the desired secondary particle and the condition of the secondary particle to be detected are coincident with each other.

10. The charged particle beam apparatus according to claim 8, wherein the setting screen is provided with a setting screen for use in setting energy of the secondary particle.

11. The charged particle beam apparatus according to claim 8, wherein the setting screen is provided with a setting screen for use in setting an angle range of an emitting angle of the secondary particle.

12. The charged particle beam apparatus according to claim 8, wherein the setting screen is provided with a setting screen for use in setting a ratio of the secondary particle that satisfies a predetermined condition with respect to the whole of the detection amount of the secondary particles at a predetermined position of the detector.

13. The charged particle beam apparatus according to claim 1, wherein the predetermined condition includes an energy range of the secondary particle detected by the detector.

14. The charged particle beam apparatus according to claim 13, wherein the predetermined condition further includes an angle range of the secondary particle detected by the detector.

15. The charged particle beam apparatus according to claim 2, wherein the distribution of the secondary particles arriving at the valid detection surface after being emitted from the sample is limited by a predetermined energy range of the secondary particles.

16. The charged particle beam apparatus according to claim 15, wherein the distribution of the secondary particles arriving at the valid detection surface after being emitted from the sample is further limited by a predetermined angle range of the secondary particles.

17. The charged particle beam apparatus according to claim 8, wherein the condition of the secondary particle to be detected by the detector includes an energy range.

18. The charged particle beam apparatus according to claim 17, wherein the condition of the secondary particle to be detected by the detector further includes an angle range.

* * * * *